United States Patent
Kashiwakura et al.

(10) Patent No.: US 10,375,818 B2
(45) Date of Patent: Aug. 6, 2019

(54) PRINTED BOARD

(71) Applicant: NEC Corporation, Minato-ku, Tokyo (JP)

(72) Inventors: Kazuhiro Kashiwakura, Tokyo (JP); Ayako Uemura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/737,876

(22) PCT Filed: Jul. 4, 2016

(86) PCT No.: PCT/JP2016/003168
§ 371 (c)(1),
(2) Date: Dec. 19, 2017

(87) PCT Pub. No.: WO2017/006552
PCT Pub. Date: Jan. 12, 2017

(65) Prior Publication Data
US 2018/0235076 A1  Aug. 16, 2018

(30) Foreign Application Priority Data
Jul. 8, 2015 (JP) .................................. 2015-137091

(51) Int. Cl.
H05K 1/11 (2006.01)
H05K 1/02 (2006.01)
(Continued)

(52) U.S. Cl.
CPC ......... *H05K 1/0216* (2013.01); *H05K 1/0218* (2013.01); *H05K 1/0243* (2013.01);
(Continued)

(58) Field of Classification Search
CPC ......... H05K 1/111; H05K 1/115; H05K 1/116
(Continued)

(56) References Cited

U.S. PATENT DOCUMENTS 6,359,237 B1    3/2002  Tohya et al.
6,726,488 B2 *  4/2004  Shirasaki ................ H01L 23/66
                                                  174/266
2012/0325537 A1  12/2012  Toyao et al.

FOREIGN PATENT DOCUMENTS

JP    H10-270862 A    10/1998
JP    H11-220263 A    8/1999
(Continued)

OTHER PUBLICATIONS

International Search Report for PCT Application No. PCT/JP2016/003168, dated Sep. 13, 2016.
(Continued)

*Primary Examiner* — Jeremy C Norris

(57) ABSTRACT

An objective of the present invention is to provide a printed board being capable of suppressing EMI emissions from power supply wirings. To accomplish the objective, a printed board of the present invention includes a plurality of ground layers disposed in a printed board, a power supply layer put between the plurality of the ground layers, and through holes disposed along at least periphery of the printed board and connecting the plurality of the ground layers, wherein the through holes are disposed at intervals according to a wavelength corresponding to a maximum frequency of electromagnetic waves to be suppressed.

Further, a printed board of the present invention includes a power supply layer disposed in a printed board and put between ground layers above and below the power supply layers, and a plurality of through holes connecting the ground layers above and below the power supply layers, wherein the plurality of the through holes are disposed at and near the power supply layer and are spaced apart at intervals according to a wavelength corresponding to a maximum frequency of electromagnetic waves to be suppressed.

9 Claims, 15 Drawing Sheets

(51) Int. Cl.
*H05K 3/46* (2006.01)
*H05K 9/00* (2006.01)

(52) U.S. Cl.
CPC .................. *H05K 1/11* (2013.01); *H05K 3/46* (2013.01); *H05K 9/0064* (2013.01); *H05K 2201/09309* (2013.01); *H05K 2201/09327* (2013.01); *H05K 2201/09609* (2013.01); *H05K 2201/10* (2013.01)

(58) Field of Classification Search
USPC .................................................. 174/780, 794
See application file for complete search history.

(56) References Cited

FOREIGN PATENT DOCUMENTS

| | | |
|---|---|---|
| JP | 2000-216509 A | 8/2000 |
| JP | 2001-053449 A | 2/2001 |
| JP | 2001-068801 A | 3/2001 |
| JP | 2007-088102 A | 4/2007 |
| JP | 2007-234500 A | 9/2007 |
| JP | 2009-224566 A | 10/2009 |
| JP | 2013-254759 A | 12/2013 |
| WO | 2011/111314 A1 | 9/2011 |

OTHER PUBLICATIONS

English translation of Written opinion for PCT Application No. PCT/JP2016/003168.

\* cited by examiner

PRINTED BOARD

This application is a National Stage Entry of PCT/JP2016/003168 filed on Jul. 4, 2016, which claims priority from Japanese Patent Application 2015-137091 filed on Jul. 8, 2015, the contents of all of which are incorporated herein by reference, in their entirety.

TECHNICAL FIELD

The present invention relates to a printed board, which suppresses electro-magnetic interference (EMI), particularly to a printed board, which suppresses EMI caused by power supply noise.

BACKGROUND ART

In recent years, getting larger capacities of information communication equipment leads increases of speed of signals or sizes of equipment and causes higher frequencies of power supply noise or multi-purposing of resonance modes in the inside of the equipment, thus having become hard to conform to EMI regulations such as Voluntary Control Council for Interference by Information Technology Equipment (VCCI).

As described below, while EMI reduction techniques have been proposed, EMI emissions have not been solved.

PTL1 (Japanese Unexamined Patent Application Publication No. 2013-254759) discloses a technique that a square ring-shaped GND wiring is arranged along the periphery of a circuit board and is connected to a GND layer in the board by a plurality of GND via holes (paragraphs [0014] to [0019], FIG. 1 etc. in PTL1). Although there are some effects for suppressing EMI by arranging the GND via holes, the effects are insufficient to block electromagnetic waves, because a great gap is presence due to the GND wiring shaped in the square ring, which the electromagnetic waves are leaked from the gap.

In addition, PTL2 (Japanese Unexamined Patent Application Publication No. H10-270862) and PTL3 (Japanese Unexamined Patent Application Publication No. 2001-53449) disclose techniques that impedance with an external power supply is increased by allowing power feeding wirings of large scale integrations (LSIs) to have inductors, thus suppressing propagation of the power supply noise to the outside (paragraphs [0023], [0025], FIGS. 2, 3 in PTL2, paragraphs [0036] to [0037], FIGS. 2, 3 in PTL3). However, the power supply noise propagates the electromagnetic waves to its circumference through between the power supply and GND as if a transmission path, so that it is hard to fundamentally suppress EMI.

In addition, PTL4 (Japanese Unexamined Patent Application Publication No. H11-220263) describes a printed wiring board for promoting the reduction of electromagnetic waves noise. The printed wiring board 1 is provided with, as middle layers, signal layers 3 on which signal patterns 2 are wired and power supply layers 5 on which power supply patterns 4 are wired. The signal layers 3 and power supply layers 5 are embedded in insulating stuff 6. On one surface (upper surface) and the opposite surface (lower surface) of the printed wiring board 1, ground patterns 7 and 8 are disposed, respectively. The ground patterns of the one surface and the opposite surface are connected by through holes 11 throughout the entire printed wiring board 1 (paragraphs [0008] to [0011], FIG. 1, FIG. 2). Further, to prevent electromagnetic noise by forming a square ring-shaped ground pattern around the signal layers and the power supply layers is also described (paragraphs [0020] to [0024], FIGS. 13, 14).

In addition, PTL5 (Japanese Unexamined Patent Application Publication No. 2007-234500) describes a technique for blocking the electromagnetic waves from signal wirings formed on a flexible board. Ground patterns are formed on both one surface and the opposite surface of a base 11 on which a plurality of high speed transmission paths (signal wirings) are arranged, and these two ground patterns are connected by a plurality of through holes 1s (paragraphs [0048] to [0053], FIGS. 1, 3, 5). Further, PTL 5 also describes that each of intervals between the plurality of the through holes 1s is equal to or below a half wavelength of a specific electromagnetic wave, thus blocking the electromagnetic waves having the wavelengths equal to or more the specific electromagnetic wave (paragraph [0063]).

CITATION LIST

Patent Literature

[PTL 1] Japanese Unexamined Patent Application Publication No. 2013-254759
[PTL 2] Japanese Unexamined Patent Application Publication No. H10-270862
[PTL 3] Japanese Unexamined Patent Application Publication No. 2001-53449
[PTL 4] Japanese Unexamined Patent Application Publication No. H11-220263
[PTL 5] Japanese Unexamined Patent Application Publication No. 2007-234500
[PTL 6] Japanese Unexamined Patent Application Publication No. 2000-216509

SUMMARY OF THE INVENTION

Technical Problem

PTL4 (Japanese Unexamined Patent Application Publication No. H11-220263) has an objective for preventing EMI from both the power supply wirings and the signal wirings. In addition, PTL5 (Japanese Unexamined Patent Application Publication No. 2007-234500) has an objective but for suppressing the electromagnetic waves from the signal wirings, not for suppressing the electromagnetic waves from the power supply wirings.

Both PTL 4 and PTL5 have the objective for suppressing the electromagnetic waves from the signal wirings. However, to the inventor's knowledge, the flow of the electromagnetic waves in the transversely directions to the signal wirings (the width and thickness directions of the wirings) is only a little, since most of energy propagation in the signal wirings occur in a transmission direction (in the longitudinal direction of the wirings). The electromagnetic waves are referred to as evanescent waves, and the energies of the evanescent waves maintain in only small and narrow range. From such matters, the EMI is mainly caused from the power supply wirings.

An objective of the present invention is to solve the problems described above and provide a printed board capable of suppressing EMI emissions from the power supply wirings.

Solution to Problem

The present invention is a printed board including: a plurality of ground layers disposed in a printed board; a power supply layer put between the plurality of the ground layers; and through holes disposed along at least periphery of the printed board and connecting the plurality of the ground layers, wherein the through holes are disposed at intervals according to a wavelength corresponding to a maximum frequency of electromagnetic waves to be suppressed.

Further, the present invention is a printed board including: a power supply layer disposed in a printed board and put between ground layers above and below the power supply layer; and a plurality of through holes connecting the ground layers above and below the power supply layer, wherein the plurality of the through holes are disposed at and near the power supply layers and are spaced apart at intervals according to a wavelength corresponding to a maximum frequency of electromagnetic waves to be suppressed.

Advantageous Effects of the Invention

According to the present invention, the printed board capable of suppressing the EMI emissions from the power supply wirings can be disposed.

DESCRIPTION OF EMBODIMENTS

First Example Embodiment

Figure 1:
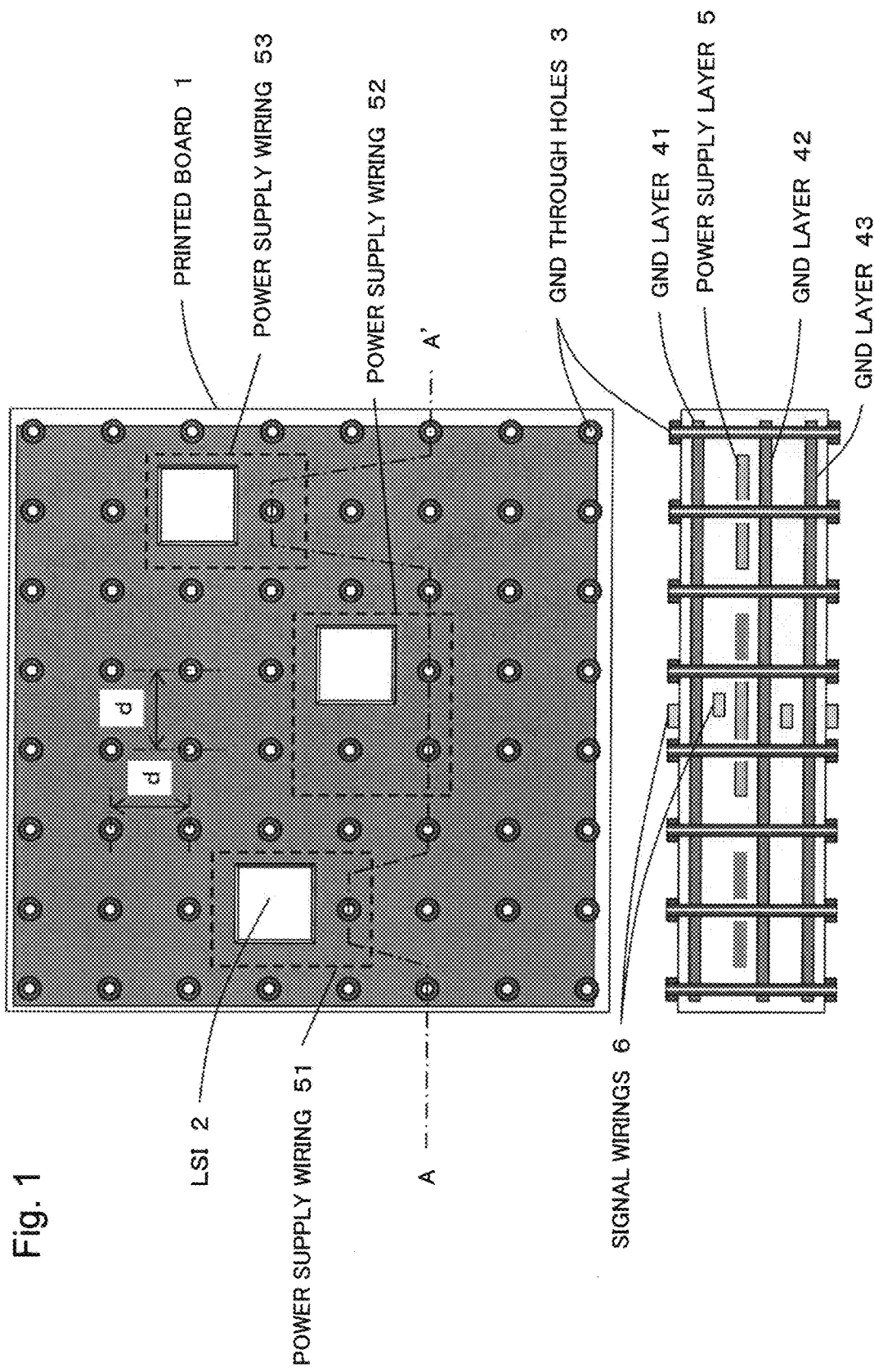
FIG. 1 is a plan view and a cross-sectional view illustrating a printed board of a first example embodiment of the present invention.
Figure 2:
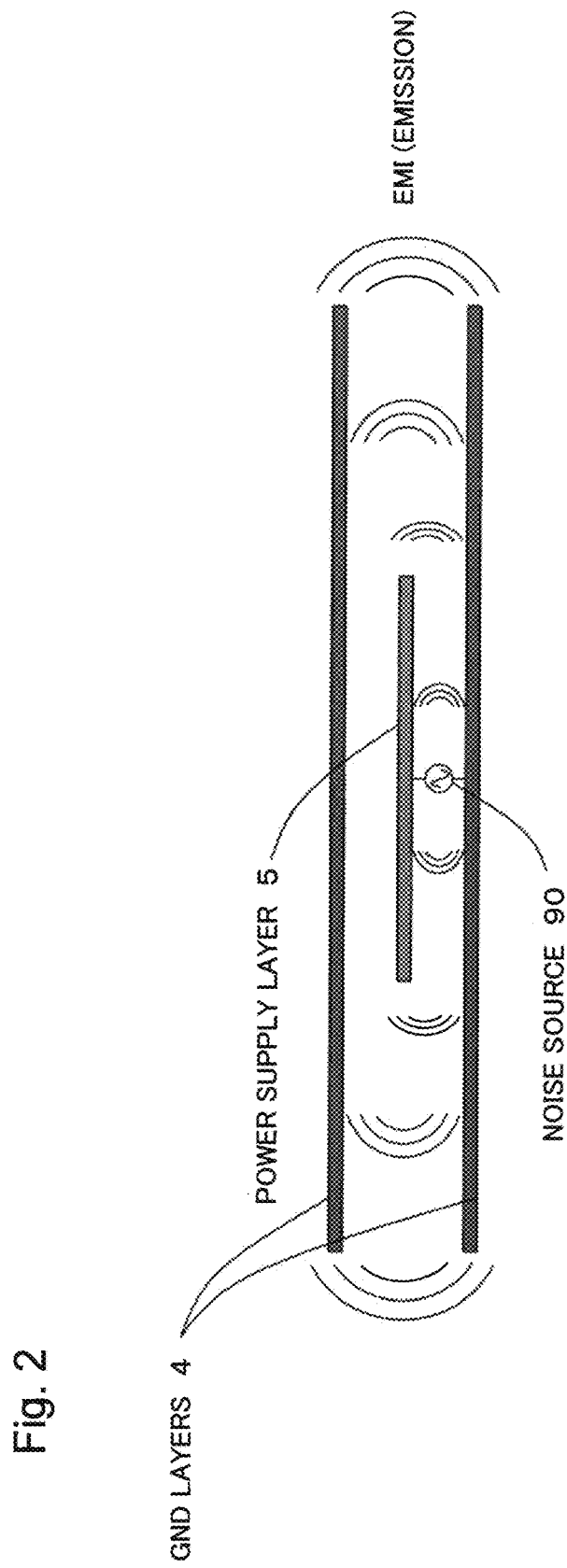
FIG. 2 is a schematic cross-sectional view for illustrating a mechanism of EMI emissions generated from the printed board.

The first example embodiment of the present invention will be described using FIG. 1 to FIG. 5.
(Description of Configurations)
FIG. 1 is the plan view and the cross-sectional view illustrating a printed board 1 of the first example embodiment of the present invention. The cross-sectional view illustrates a cross section taken along a dashed-dotted line A-A' in the plan view. For easily understandable, the cross section is presented not by cutting along a straight line, but by taken along a polygonal line so as to pass positions containing the power supply layers. The printed board 1 is a multilayer printed board in which, by putting insulating layers therebetween, power supply layers 5 and signal wirings 6 are formed.

On at least directly under a component surface (in FIG. 1, one surface side on which LSI 2 is disposed) and directly over a solder surface (the opposite surface side opposite to the component side), GND layers 41, 42, 43 are formed as grounds that are formed in the entire area of the board (solid plane grounds). Note that in FIG. 1, illustrations of solders are omitted. In the entire surface of the board, the GND through holes 3 are arranged at intervals of d (described later) in a grid pattern and connect at least two GND layers (GND layers 41, 42). In the present example embodiment, the GND through holes 3 connect all of the GND layers 41, 42, 43 by penetrating therethrough. The power supply wirings 51, 52, 53 are formed in the same layer of the printed board 1 and are put between the GND layers 41, 42. Hereinafter, in some cases, the power supply wirings 51, 52, 53 are also referred to as power supply layers 5 collectively. In positions where components such as the LSI 2 are implemented, the GND through holes 3 may be omitted. There are positions where the GND through holes 3 penetrate through the power supply layers 5. In the penetrated positions, there are gaps (clearances) between the GND through holes 3 and power supply layers 5, and the gaps are filled with insulating stuff.
(Description of Operations)
The mechanism of EMI emissions generated from the printed board 1 will be described using FIG. 2. A board configuration applied in the present example embodiment is the power supply layers 5 (corresponding to power supply wirings 51, 52, 53) put between the GND layers 4 (corresponding to GND layers 41, 42). By operations of integrated circuits (ICs) the power supply current is changed, and a potential between the power supply layers 5 and GND layers 3 subsequently changes, i.e., an electric field changes, thus generating electromagnetic waves. This is illustrated with a noise source 90 in FIG. 2. The generated electromagnetic waves are propagated to all directions through between the power supply layers 5 and GND layers 4 as if a transmission path. The propagated electromagnetic waves are further propagated until edges of the board through, e.g., between the GND layer 42 and GND layer 43 or between the other power supply layer and GND layer even in the range where there are no power supply layers 5, or between the power supply layer and the power supply layer, as if the transmission path. The electromagnetic waves propagating from the edges of the board to the outside of the board are the EMI emissions.

Figure 3:
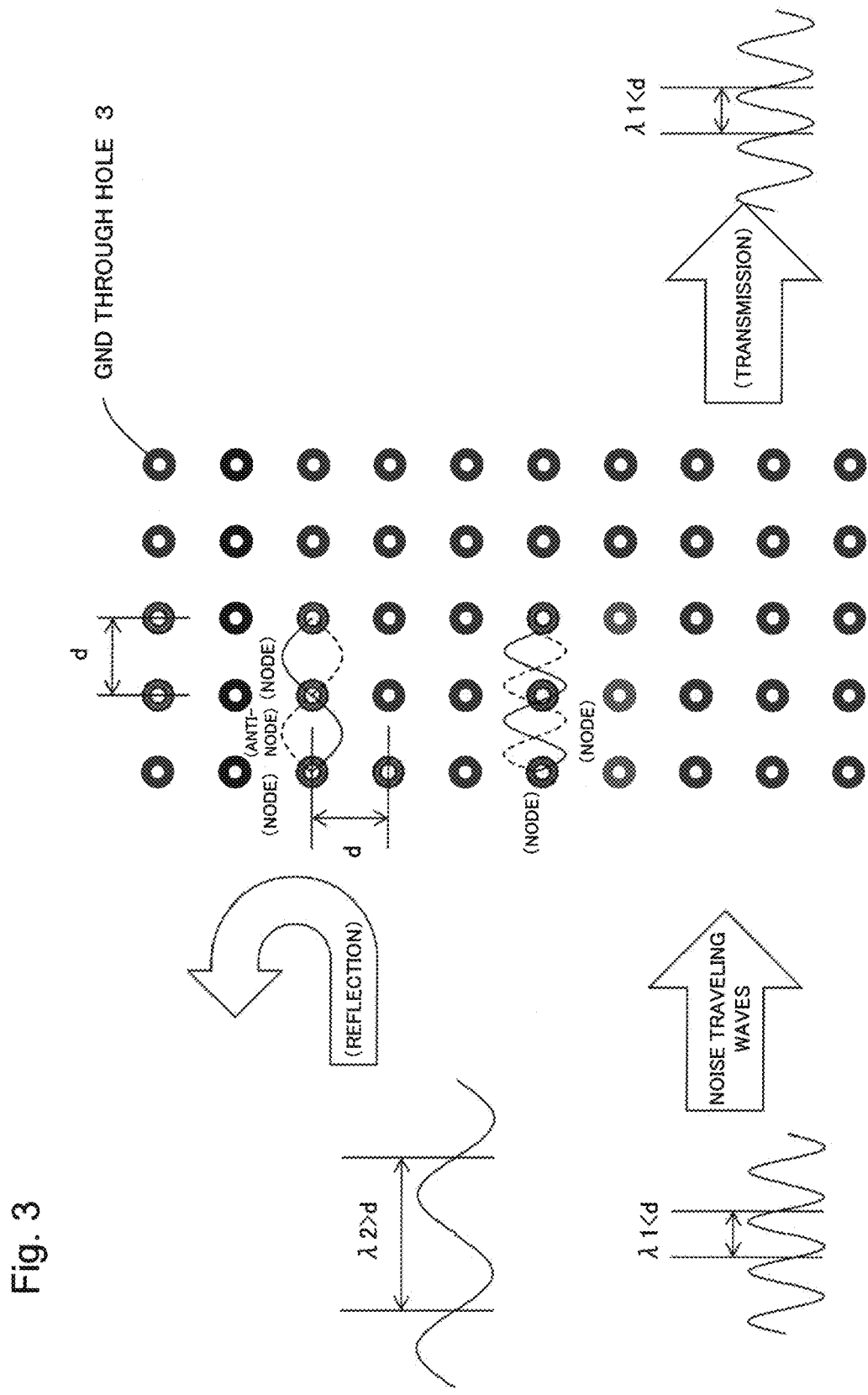
FIG. 3 is a diagram for illustrating a mechanism of blocking electromagnetic waves by GND through holes.

FIG. 3 illustrates the mechanism for blocking the electromagnetic waves by the GND through holes 3. Ideally, the GND through holes 3 have impedance of zero and do not allow the electromagnetic waves to pass except the electromagnetic waves whose nodes locating at the GND through holes 3. Realistically, since the GND through holes 3 do not have impedance of zero, traveling electromagnetic waves travel while attenuating. This is illustrated as a noise traveling wave in FIG. 3. Therefore, an electromagnetic wave having a shorter wavelength λ1 than a grid interval d can propagate (transmit) across the grid formed by a plurality of the GND through holes 3. However, an electromagnetic wave having a longer wavelength λ2 than the grid interval d, which behaves as if running into a metal plate (impedance of zero), cannot propagate across the grid and is reflected.

By utilizing this nature, the electromagnetic waves can be suppressed by arranging the plurality of the GND through holes 3 using a sufficiently narrower grid interval than the wavelength of frequencies to be suppressed as EMI, where it is assumed that the interval is narrower than a quarter (from a node to an anti-node) of the wavelength. An upper limit of the frequencies to be suppressed as EMI is set as $f_{max}$, relative dielectric constant of the printed board as $ε_r$, and light velocity as $C_0$, thus being capable of leading the following condition:

$$d ≤ λ/4 = C_0/(4·f_{max}·\sqrt{ε_r})  \quad \text{(math 1)}$$

As illustrated in FIG. 3, the electromagnetic wave having a longer wavelength than λ/2 cannot pass through the grid of the GND through holes 3. If the GND through holes 3 are perfect conductors, the each of the intervals thereof may be defined at λ/2. However, if the interval is defined at λ/2, the electromagnetic waves can pass through the grid of the GND through holes 3, because actual through holes are not perfect conductors. Therefore, the math 1 has been defined by setting the grid interval as λ/4. Taking the relative dielectric constant of the printed board at 4 and the maximum frequency $f_{max}$ to be suppressed at 1 GHz yields:

$$d ≤ 3×10^8/(4×1×10^9×\sqrt{4}) = 37.5 \text{ mm}$$

Figure 4:
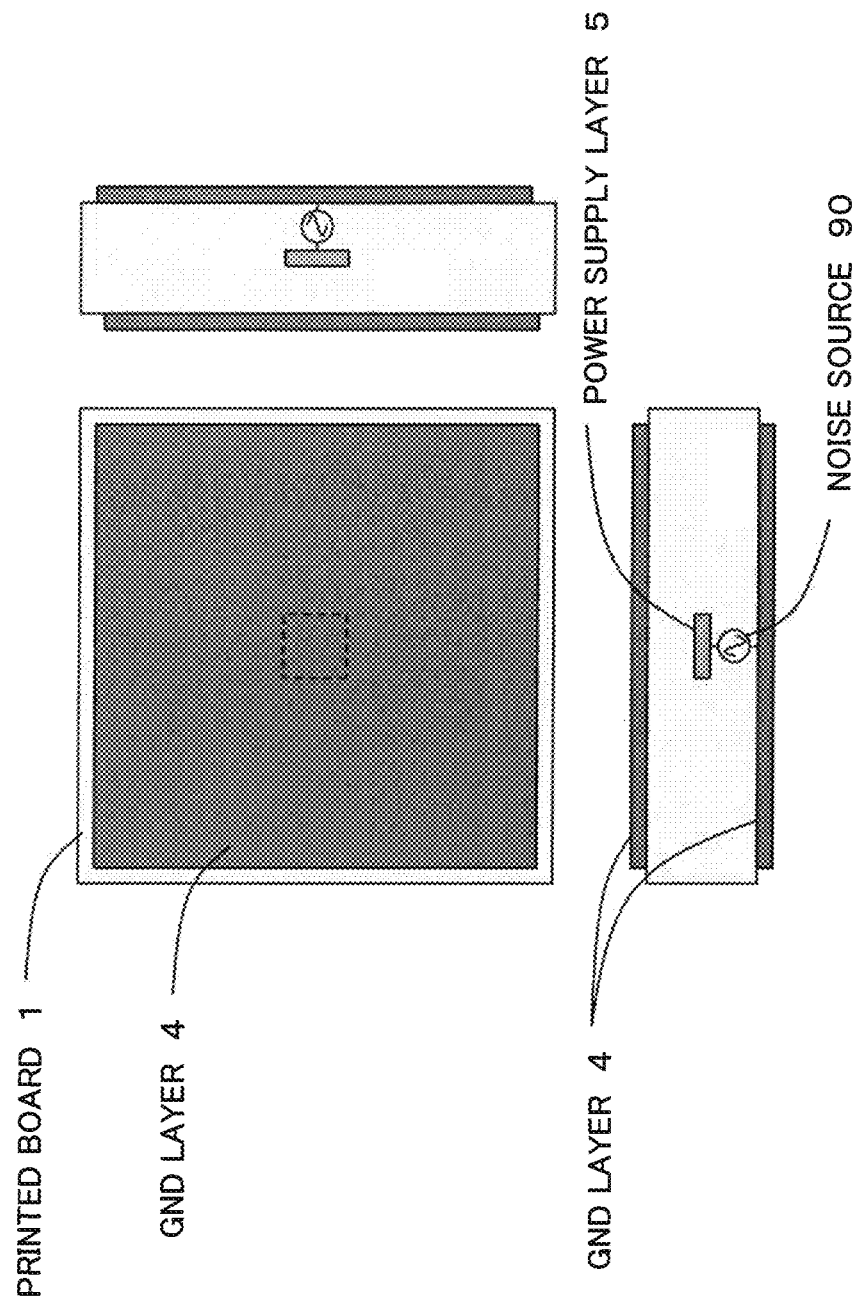
FIG. 4 is a diagram illustrating an analytical model for electromagnetic field analysis in the first example embodiment.

For verification of these effects, an analytical model for the electromagnetic field analysis like FIG. 4 is made, and the effects are verified by the electromagnetic field analysis. The analytical model is as follows: two GND layers 4 are formed in the printed board 1, and a power supply layer 5 is put between the two GND layers 4; in the model, noise is applied by a noise source 90, which is disposed between the GND layer 4 and power supply layer 5, and then the electric field intensities of the electromagnetic waves by the application of the noise are analyzed.

Figure 5:
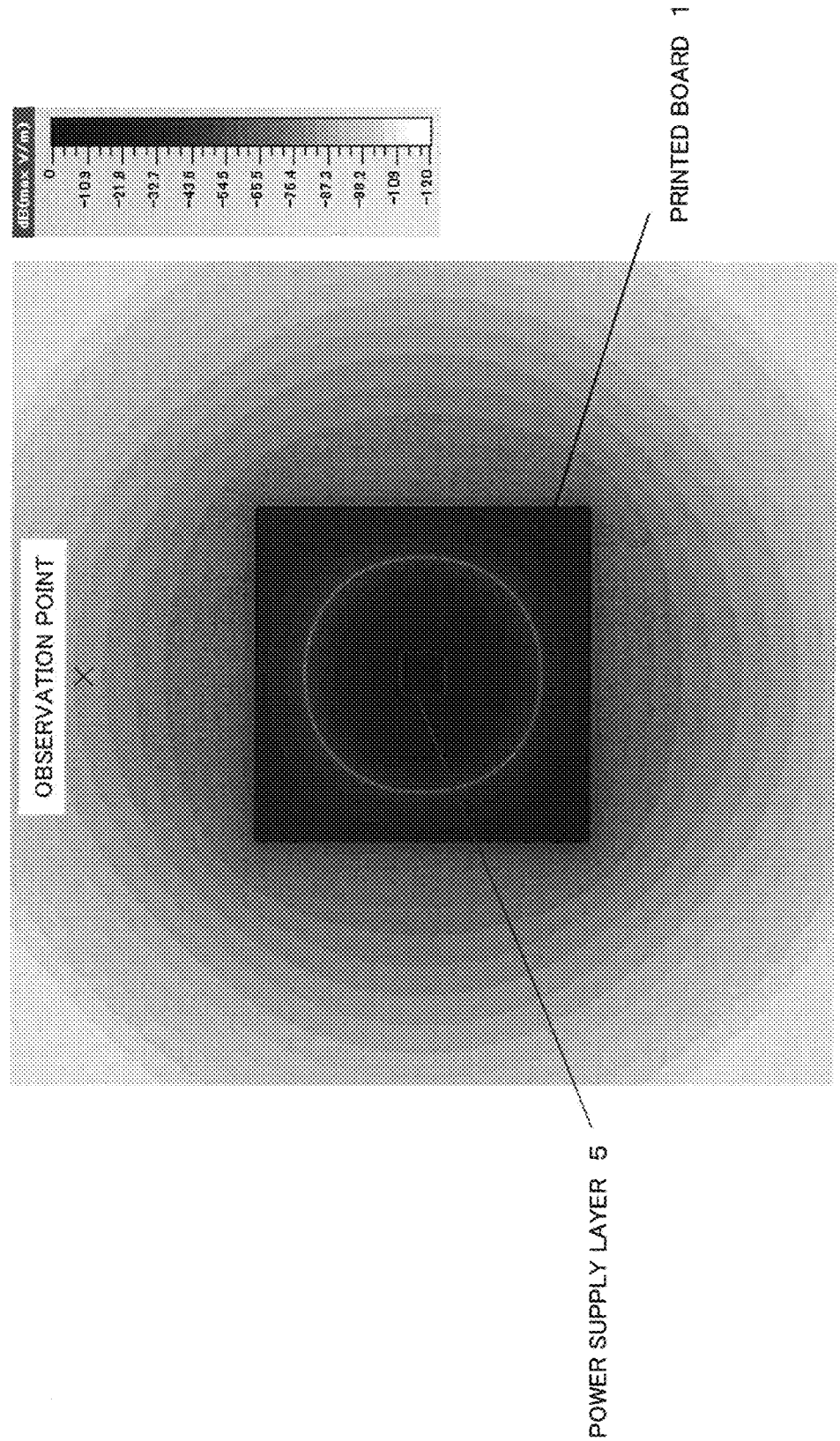
FIG. 5 is a diagram illustrating an analysis result of electric field intensities in the inside and outside of the printed board when the GND through holes are not formed.
Figure 6:
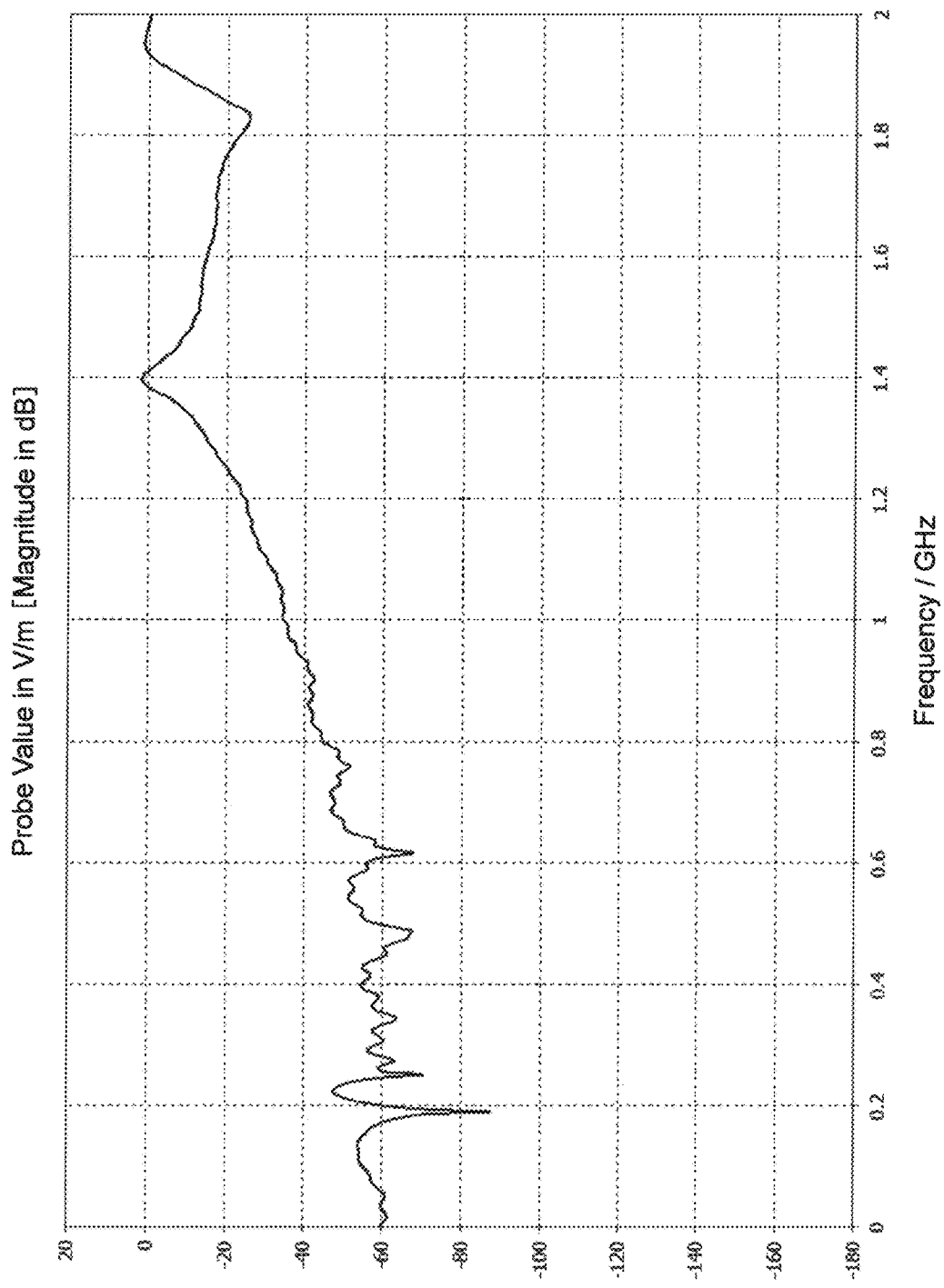
FIG. 6 is a result of analyzing a relationship between frequencies and the electric field intensities measured by a probe, which is positioned at an observation point in the outside of the board, when the GND through holes are not formed in FIG. 5.
Figure 7:
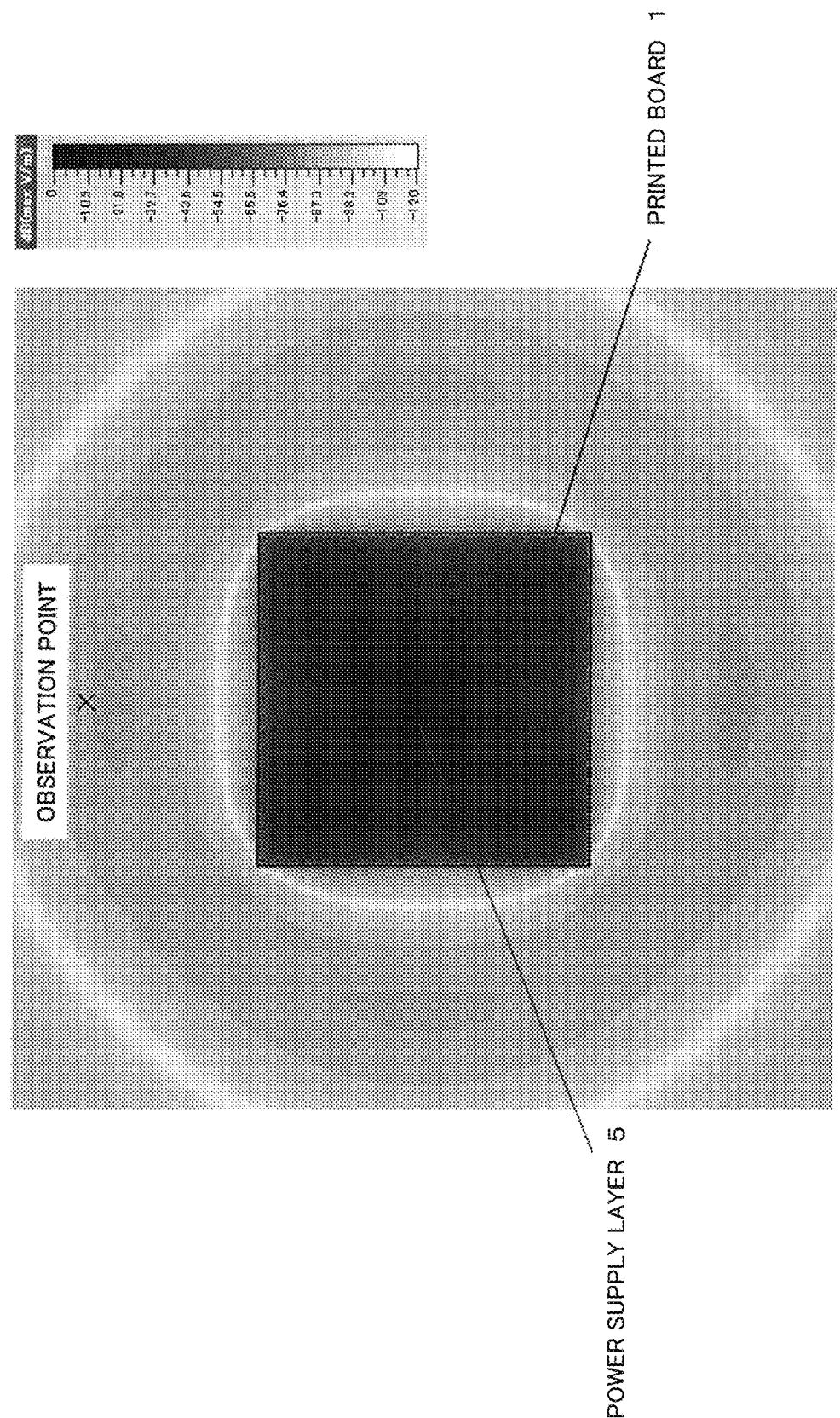
FIG. 7 is a diagram illustrating an analysis result of the electric field intensities in the inside and outside of the printed board when the only single layer (single row) of the GND through holes is formed along the periphery of the board.
Figure 8:
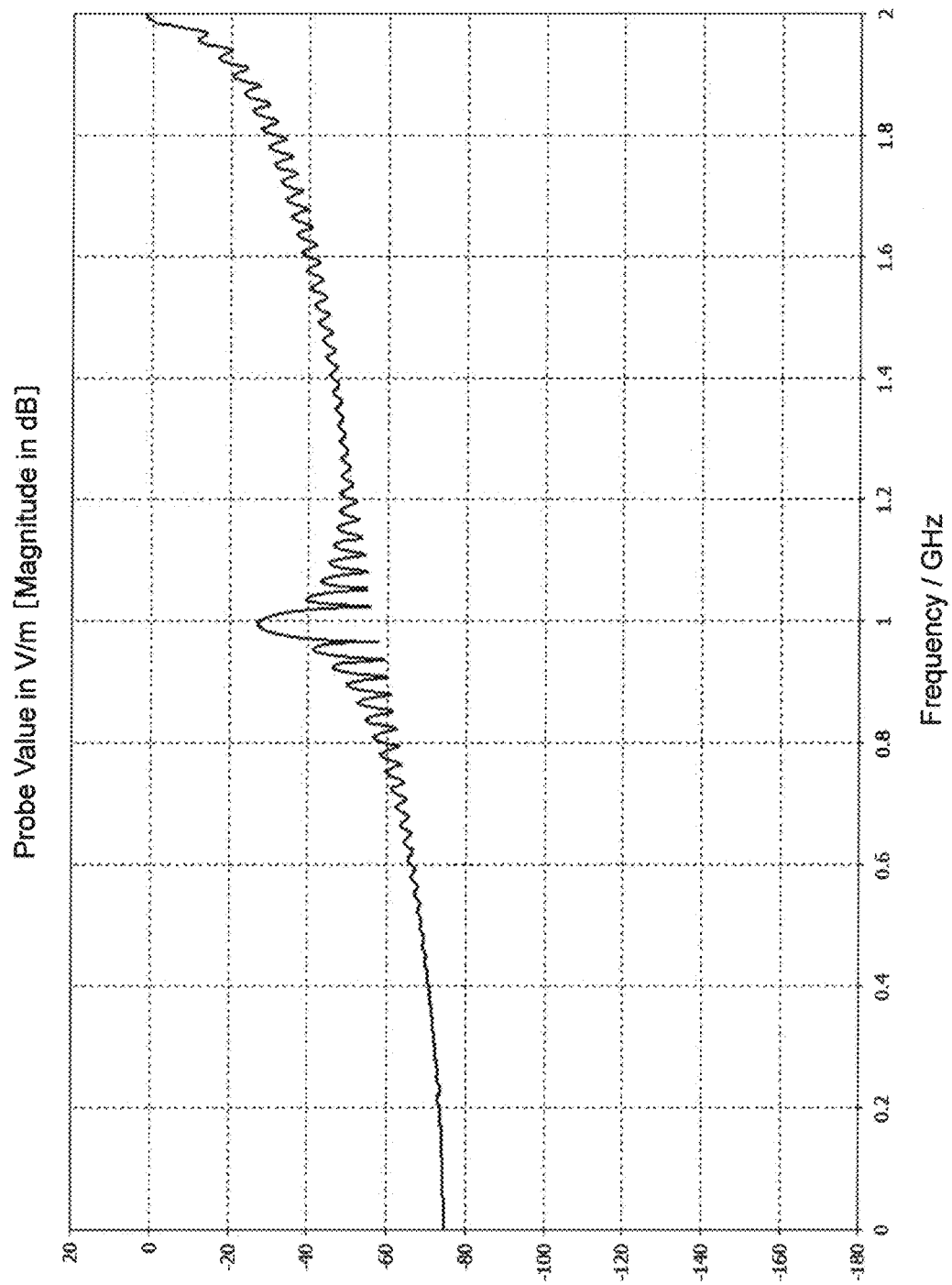
FIG. 8 is a diagram where the configuration of FIG. 7 is analyzed similar to FIG. 6.
Figure 9:
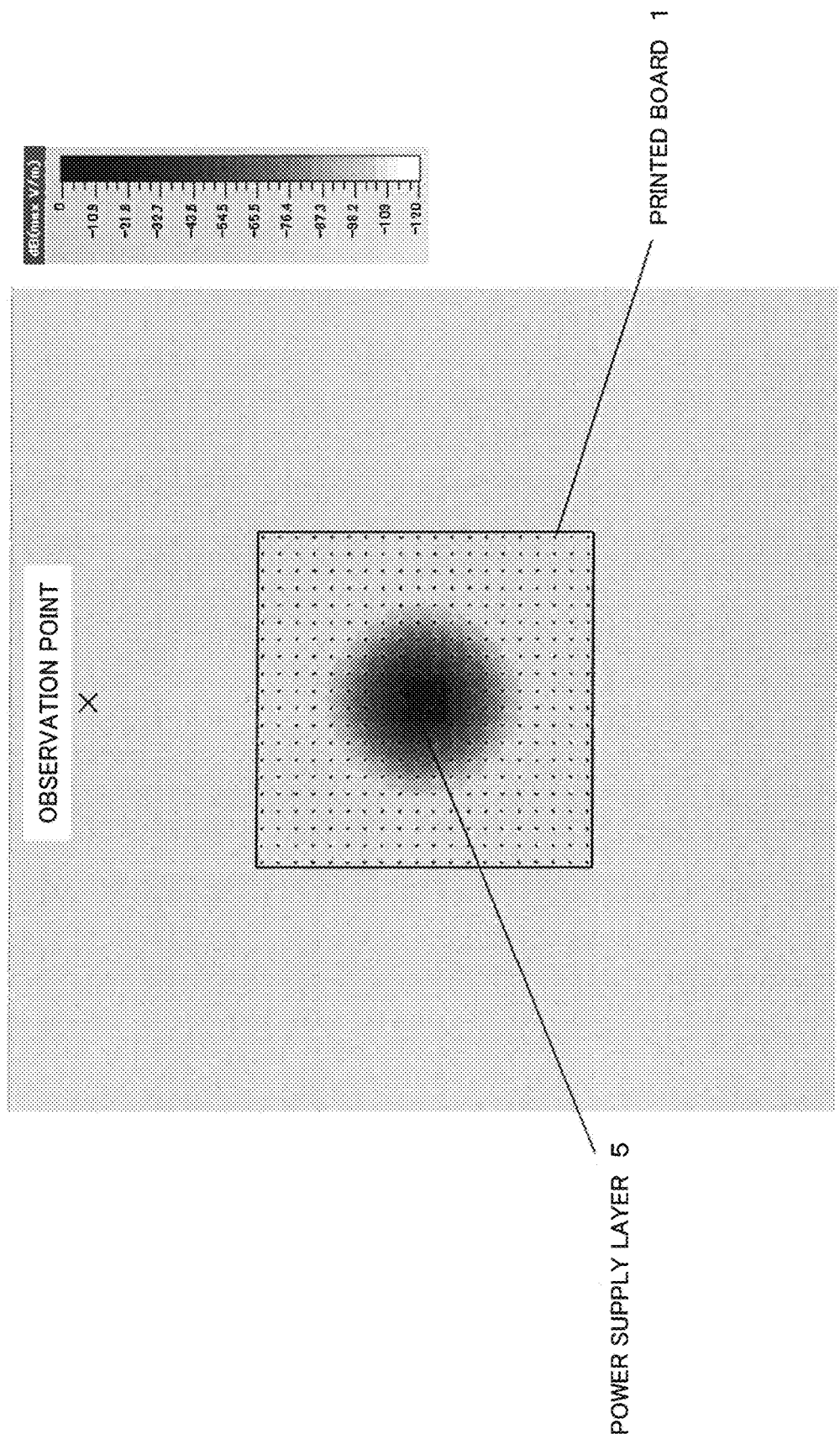
FIG. 9 is a diagram illustrating an analysis result of the electric field intensities in the inside and outside of the printed board when the GND through holes are formed in the entire board.

The analysis results are illustrated in the FIG. 5 to FIG. 10. The conditions are as follows: in FIG. 5, FIG. 6, no GND through holes are arranged in the printed board; in FIG. 7, FIG. 8, the GND through holes are arranged along only the periphery of the printed board; in FIG. 9, FIG. 10, the GND through holes are arranged in the entire printed board. In FIG. 5, 7, or 9, a black smallest square at the central portion of the printed board 1 is the power supply layer 5. Although the actual power supply layer (power supply wiring) has an elongate shape, the analysis has been made assuming herein that the power supply layer is a square for simplifying the analysis. Further, a scale in upper right side of FIG. 5, 7, or 9 directs from zero to negative numeric values. As the numeric values direct toward negative, the electric field intensities are lower; as the numeric values close to zero, the electric field intensities are higher. The unit thereof is dB·V/m, and the scales in the figures are presented using the unit of "max dB·V/m", because the relative values in which the injected energy is assumed as a maximum value (zero dB or one) are plotted in the figures.

FIG. 5 is the analysis result of the electric field intensities in the inside and outside of the printed board when the through holes are not formed. FIG. 5 illustrates the state that the EMI emissions are generated by leakage, to the outside of the board, of the electric fields from the power supply wirings.

FIG. 6 is the view for illustrating of, concerning to the printed board having no through holes of FIG. 5, the relationship between the frequencies and the electric field intensities measured by the probe, which is positioned at the observation point (a sign × in the figure) in the outside of the board. The horizontal axis shows the frequencies (GHz), and the vertical axis shows the electric field intensities (dB·V/m) represented in dB. With reference to FIG. 6, upon the frequency being equal to or more than 1 GHz, the electric field intensities reach up to zero dB·V/m over −40 dB·V/m.

FIG. 7 is the analysis result of the electric field intensities in the inside and outside of the printed board 1 when the only single layer (single row) of the GND through holes 3 is formed along the periphery of the printed board. Although FIG. 7 is more improved than FIG. 5, it illustrates a state that the EMI emissions are still generated in the outside of the board 1.

FIG. 8 is the result where the configuration of FIG. 7 is analyzed similar to FIG. 6 and illustrates a state in which the electric field intensities is still high while more improved, thus generating the EMI emissions in the outside of the board.

FIG. 9 is the analysis result of the electric field intensities in the inside and outside of the printed board 1 when the through holes are formed in the entire board. FIG. 9 illustrates a state that there are no EMI emissions to the outside of the board 1, and also in the inside of the board 1, the electromagnetic waves stay in circumference of the power supply layer 5.

Figure 10:
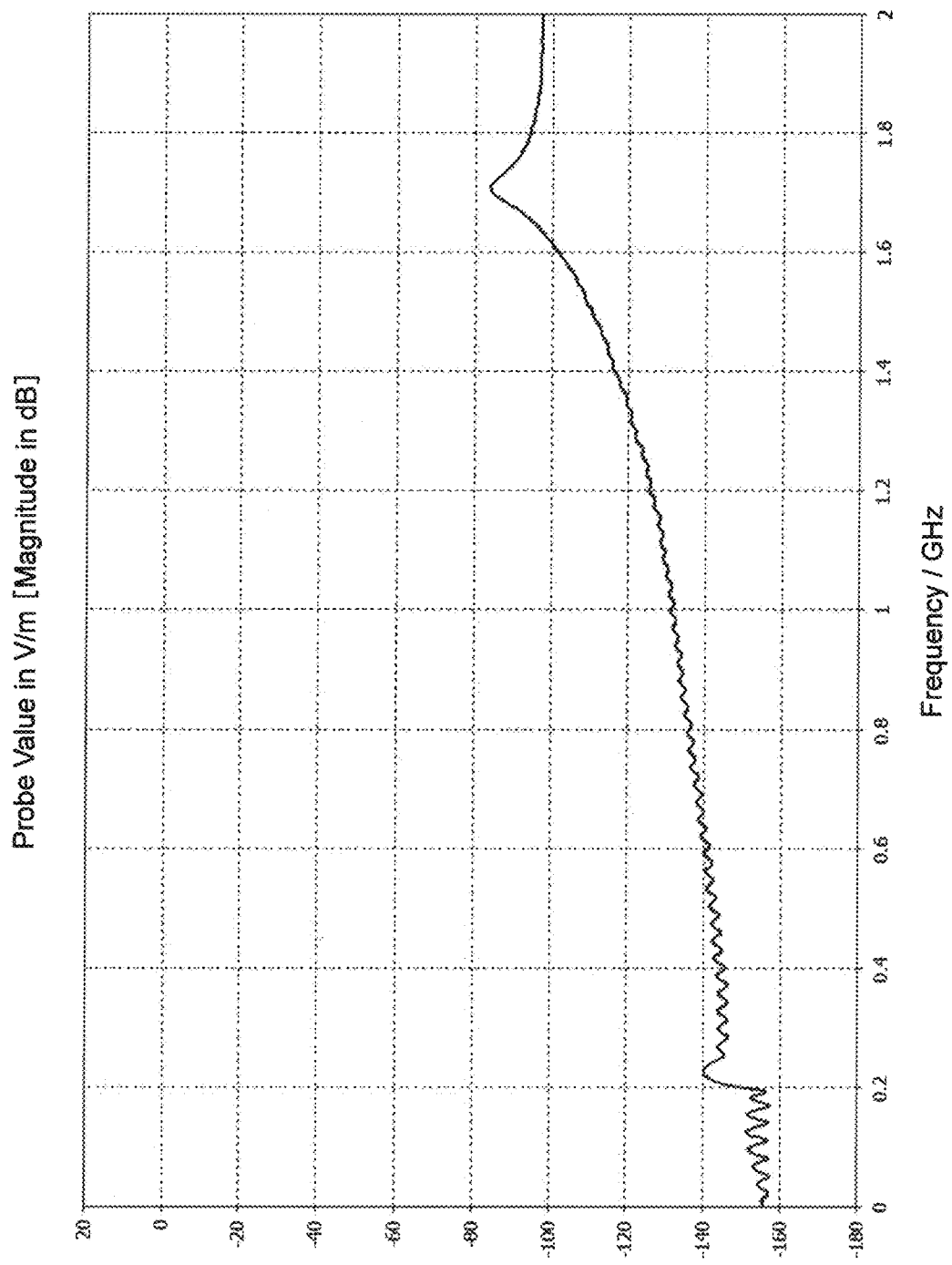
FIG. 10 is a diagram where the configuration of FIG. 9 is analyzed similar to FIG. 6.

FIG. 10 is the result where the configuration of the FIG. 9 is analyzed similar to FIG. 6 and illustrates that the electric field intensities are below −80 dB·V/m throughout the measured frequencies, thus being substantially improved.

(Descriptions of Effects)

The propagations of the power supply noise to circumference of the printed board can be suppressed by disposing the GND through holes in the grid pattern in the entire board surface, thus being capable of suppressing the EMI emissions.

Note that in FIG. 1, all of three power supply wirings 51, 52, 53 are positioned on the same layer. However, some of the power supply wirings may be on another layer in the board or all of the power supply layers may be on separate layers as long as each power wiring is put between the GND layers above and below the each power wiring and is connected by the GND through holes 3. For example, when the power supply wiring 51 is positioned not between GND layers 41 and 42 but between the GND layers 42 and 43 in FIG. 1, the GND layers 42, 43 and the GND through holes connecting therebetween suppress the emissions of the electromagnetic waves from the power supply wiring 51 to the outside. Further, when the power supply wiring 53 is positioned not between the GND layers 41 and 42 but between the GND layer 41 and the one surface on which the LSI is disposed, a new GND layer is disposed between the GND layer 41 and the one surface.

In addition, as described above, by calculating the foregoing (math 1) by taking the relative dielectric constant of the printed board at 4 and the maximum frequency $f_{max}$ to be suppressed at 1 GHz, the grid interval d is equal to or below 37.5 mm. However, the PTL 4 (Japanese Unexamined Patent Application Publication No. H11-220263) describes that the intervals between the through holes are 20 mm square when the electromagnetic waves noise is 1 GHz (in paragraph [0011]). There is a difference between the grid interval in the PTL 4, which is necessary to be relatively narrower like 20 mm and the grid interval in the present example embodiment, which may be the relatively wider grid interval like 37.5 mm. It is considered that the difference is caused by the objective, in the PTL 4, to prevent the EMI from both the power supply wirings and the signal wirings while the present example embodiment has the objective to prevent the EMI from the power supply wirings.

Second Example Embodiment

In the conditions analyzed in FIG. 7, although the only single circuit of the GND through holes 3 is arranged along the periphery of the board, the EMI emissions are generated in the outside of the board 1. An effect for preventing to travel the electromagnetic waves is provided by not arranging the GND through holes 3 on the entire board surface but radially arranging in double circuits, triple circuits, or more thereof on the board.

Figure 11:
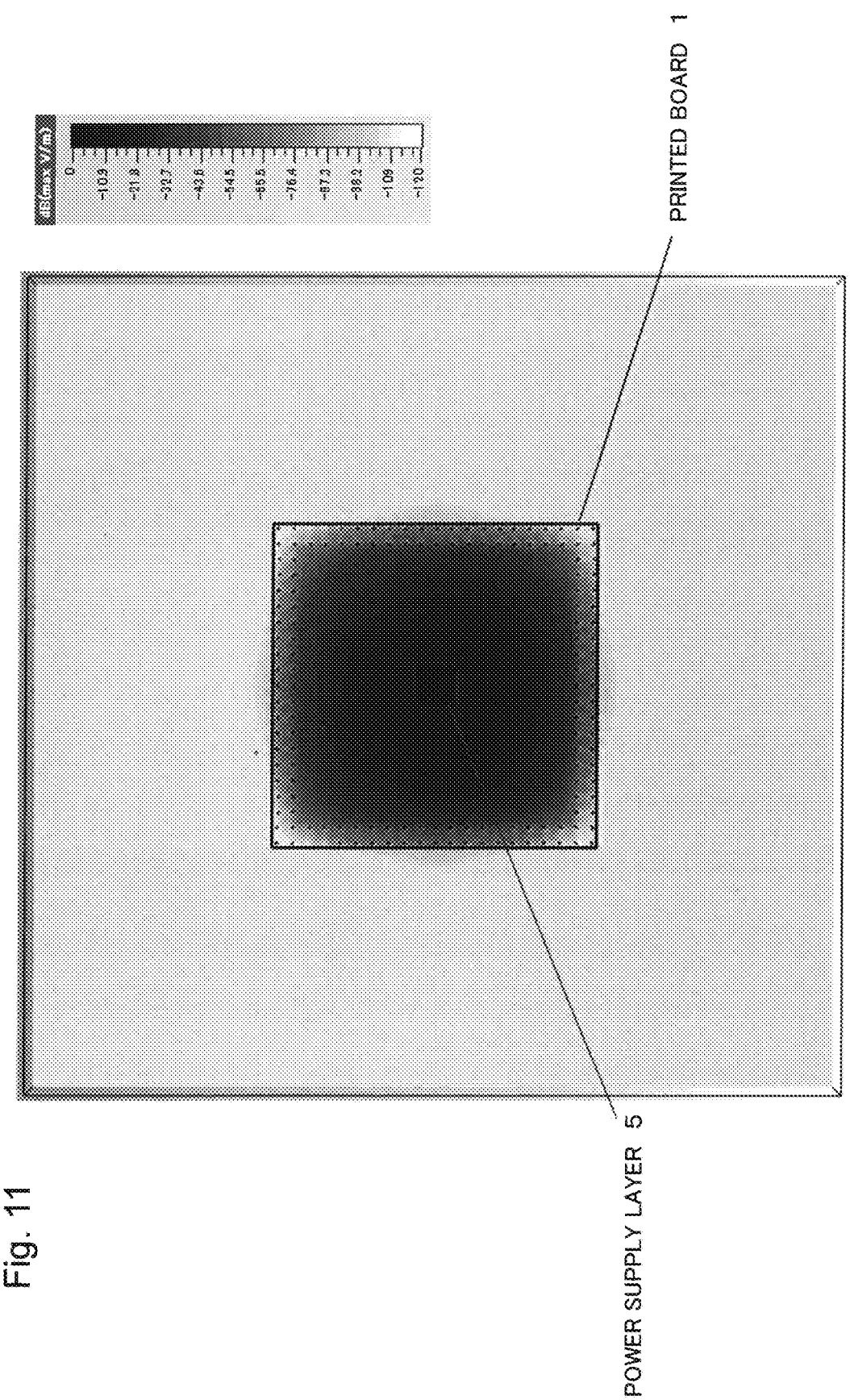
FIG. 11 is a diagram illustrating an analysis result of the electric field intensities in the inside and outside of the printed board when double circuits (double rows) of the GND through holes are radially formed along the periphery of the board.
Figure 12:
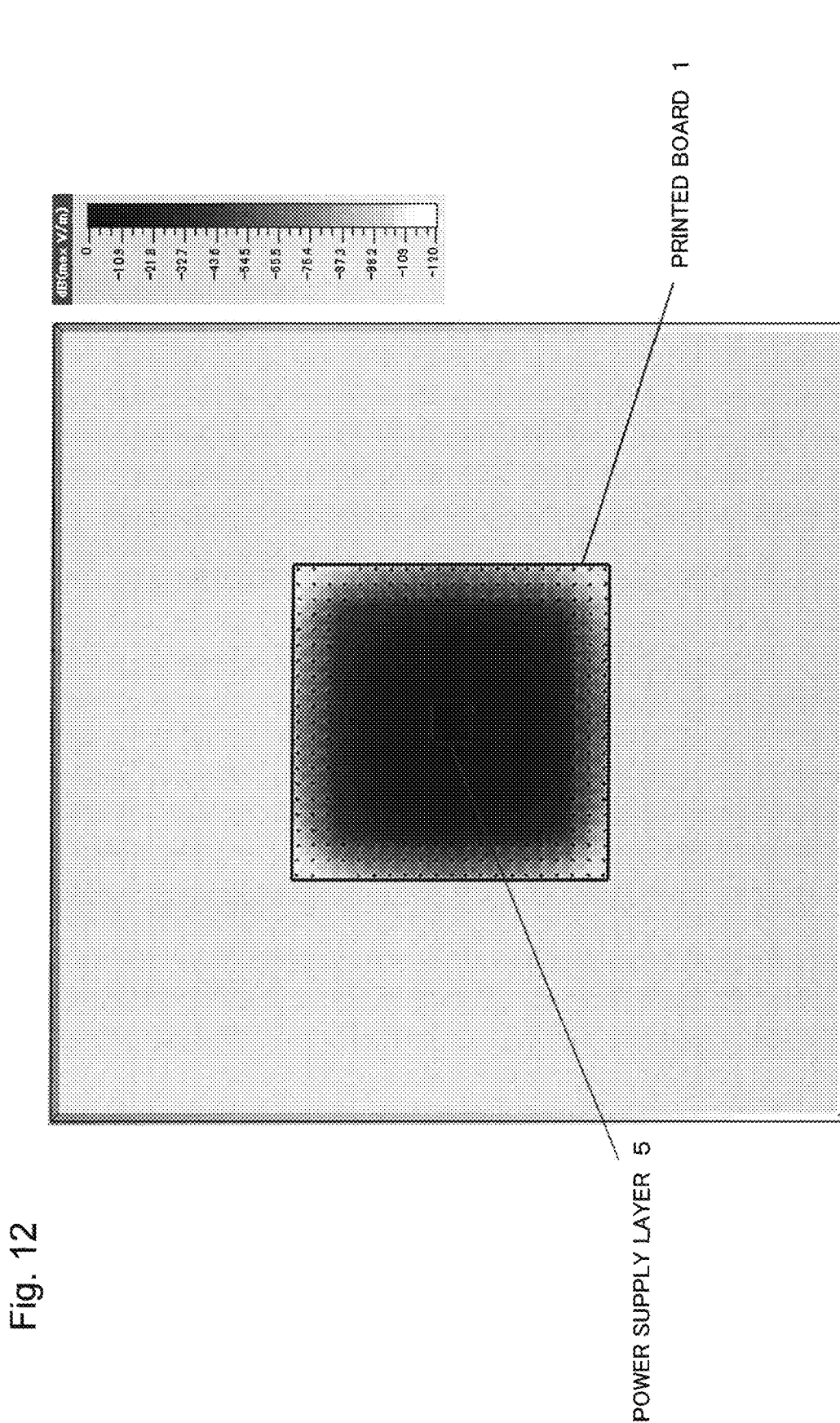
FIG. 12 is a diagram illustrating an analysis result of the electric field intensities in the inside and outside of the printed board when triple circuits (triple rows) of GND through holes are radially formed along the periphery of the board.
Figure 13:
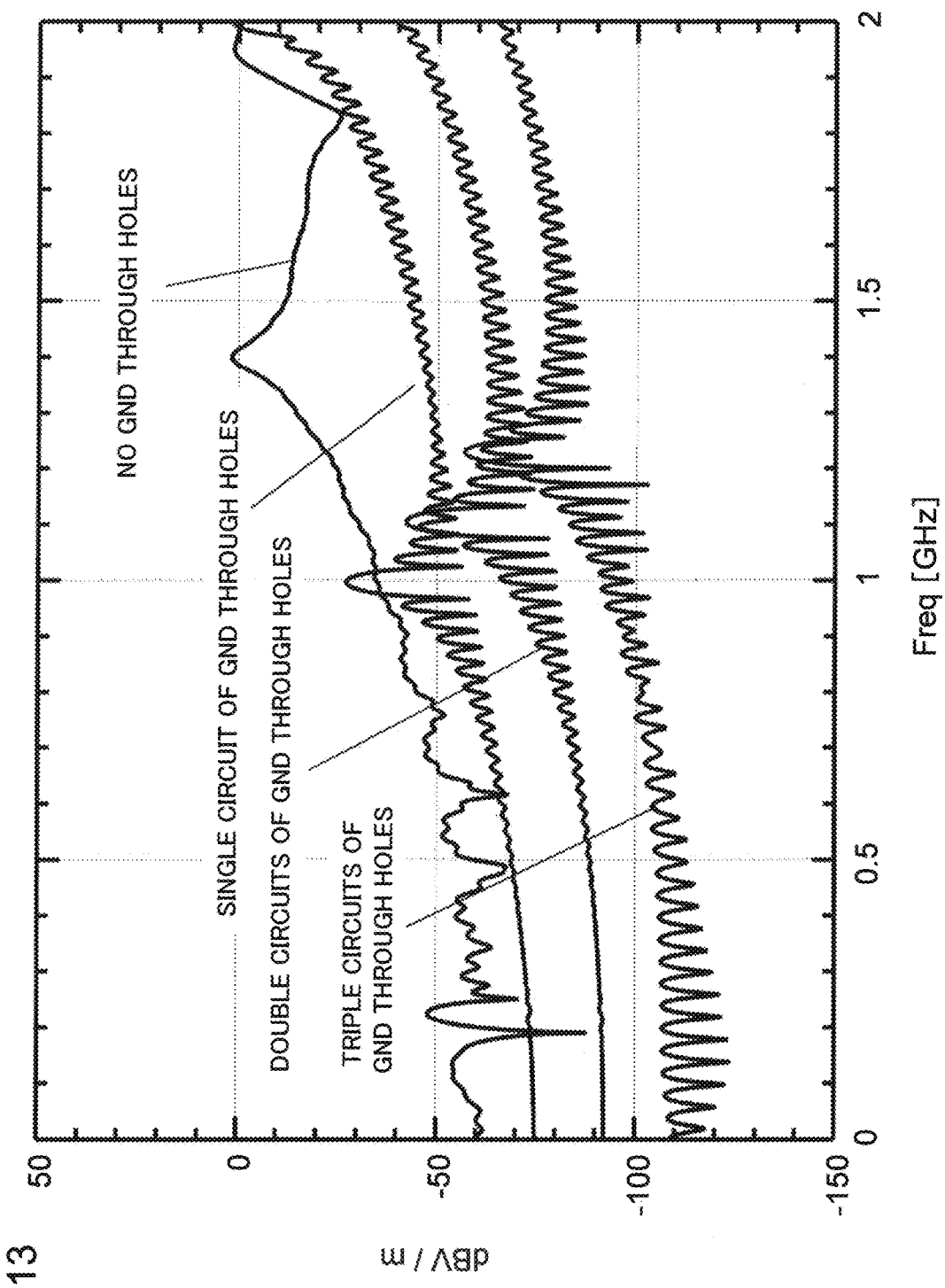
FIG. 13 is a result of analyzing the relationship between the frequencies and the electric field intensities measured by the probe, which is positioned at the observation point in the outside of the board, when the double and the triple circuits of the GND through holes are radially formed in FIGS. 11, 12, respectively.

FIG. 11 and FIG. 12 are the analysis results of the electric field intensities in the inside and outside of the printed board 1 when the double circuits of the GND through holes 3 are arranged, and the triple circuits thereof are arranged, respectively. In both FIGS. 11 and 12, the EMI emissions to the outside of the board are not observed. FIG. 13 is the results of analyzing the relationship between the frequencies and the electric field intensities measured by the probe, which is positioned at the observation point outside the board, concerning FIGS. 11, 12. For comparison, FIG. 13 additionally illustrates the results when no GND through holes arranged (FIG. 5, 6) and the only single circuit thereof arranged (FIG. 7, 8).

In also the PTL 4 (Japanese Unexamined Patent Application Publication No. H11-220263), although a square ring-shaped ground pattern is formed around the signal layer and the power supply layer, only single layer of the ground pattern is formed along the periphery of the printed wiring board, so that it is not sufficiently to suppress the EMI emissions to the outside of the board. Because the through holes are not the perfect conductors and have a certain degree of impedance, as described in the (math 1). The electromagnetic waves are confined sufficiently by increasing the number of the through holes rows to double circuits, triple circuits or the like.

Third Example Embodiment

Figure 14:
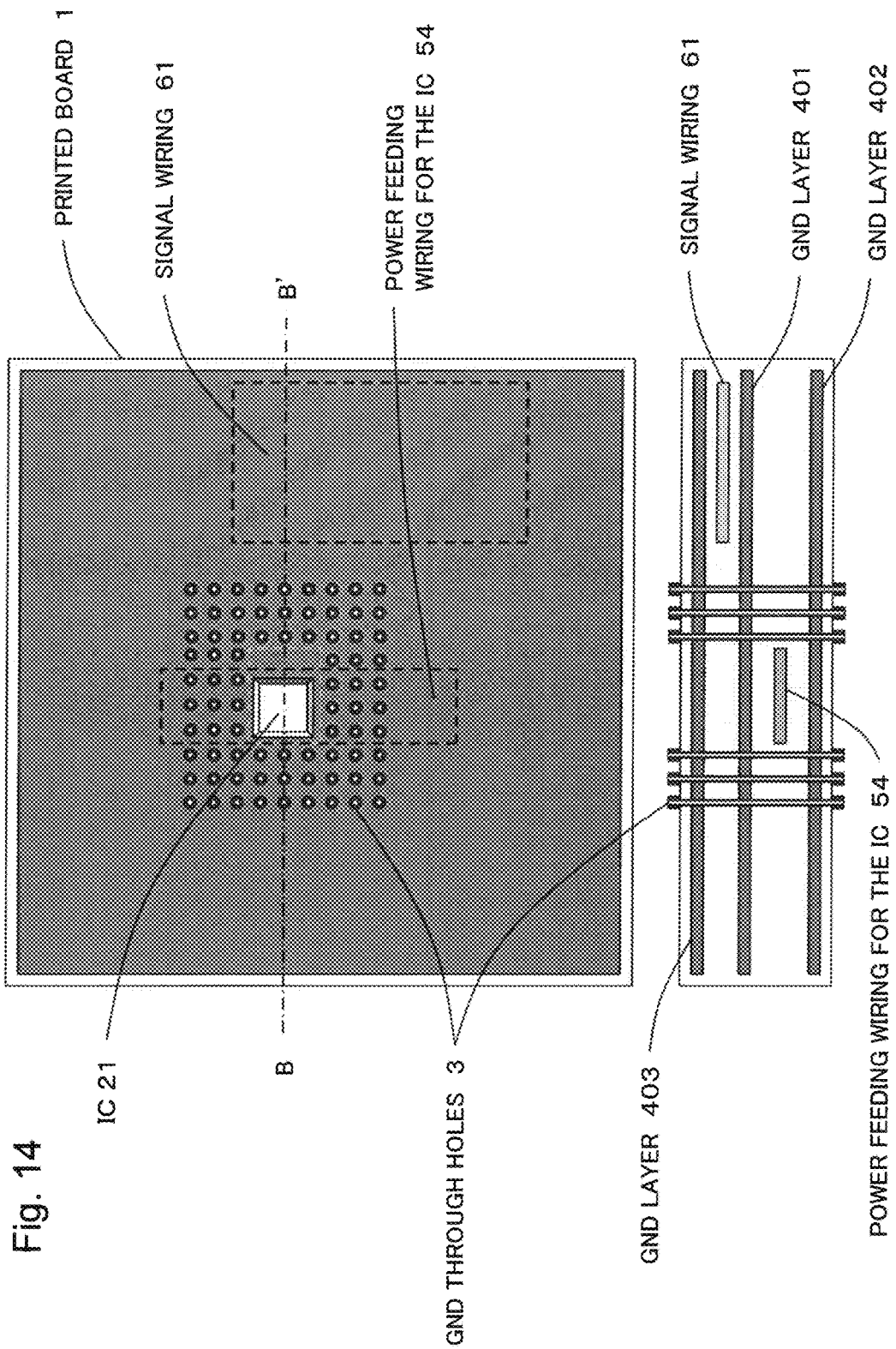
FIG. 14 is a plan view and a cross-sectional view illustrating a third example embodiment of the present invention.

FIG. 14 is the plan view illustrating the third example embodiment of the present invention and the cross-sectional view taken along the B-B' thereof. In the B-B' cross sectional view, the IC is omitted. In the first and second example embodiments, the propagations of the power supply noise to the outside of the printed board have been suppressed. In the present example embodiment, the propagations of the power supply noise to circumference of the power supply layers in the board are suppressed.

In the present example embodiment, the power supply layer, i.e., a power feeding wiring for the IC 54, is in a lower layer than the IC 21 and runs across the printed board 1 along the vertical direction of the plan view. The GND layer 401 and GND layer 402 are formed above and below the power feeding wiring for the IC 54, respectively, and the GND through holes 3 are disposed only around the power feeding wiring for the IC 54, which is the source of the power supply noise. In FIG. 14, there are GND through holes 3 that penetrate through the power feeding wiring for the IC 54 and that are formed on each side of the power feeding wiring for the IC 54. In the GND through holes 3 that penetrate through the power feeding wiring for the IC 54, there are gaps (clearances) between the GND through holes 3 and power supply layers 5 at the penetrated positions, and the gaps are filled with the insulating stuff, like the first example embodiment. Note that the GND through holes 3 are not formed above and below the IC 21. In FIG. 14, a cross section containing the IC 21 is illustrated, therefore the GND through holes penetrating through the power feeding wiring for the IC 54 are not illustrated.

Further, although triple rows and four rows of the GND through holes 3 are formed in the left and right side of the power feeding wiring for the IC 54, respectively (in left and right sides of the IC 21, triple rows thereof on each side), at least two rows of the GND through holes on each side of the power feeding wiring for the IC 54 may be arranged, for similar reason to when arranged in the periphery of the board described above.

In the present example embodiment, it is not necessary for suppressing the EMI to form the GND through holes along the periphery or in the entire of the printed board 1. Therefore, the other components and the wirings can be arranged in a higher density, and also there is much latitude of designs.

Figure 15:
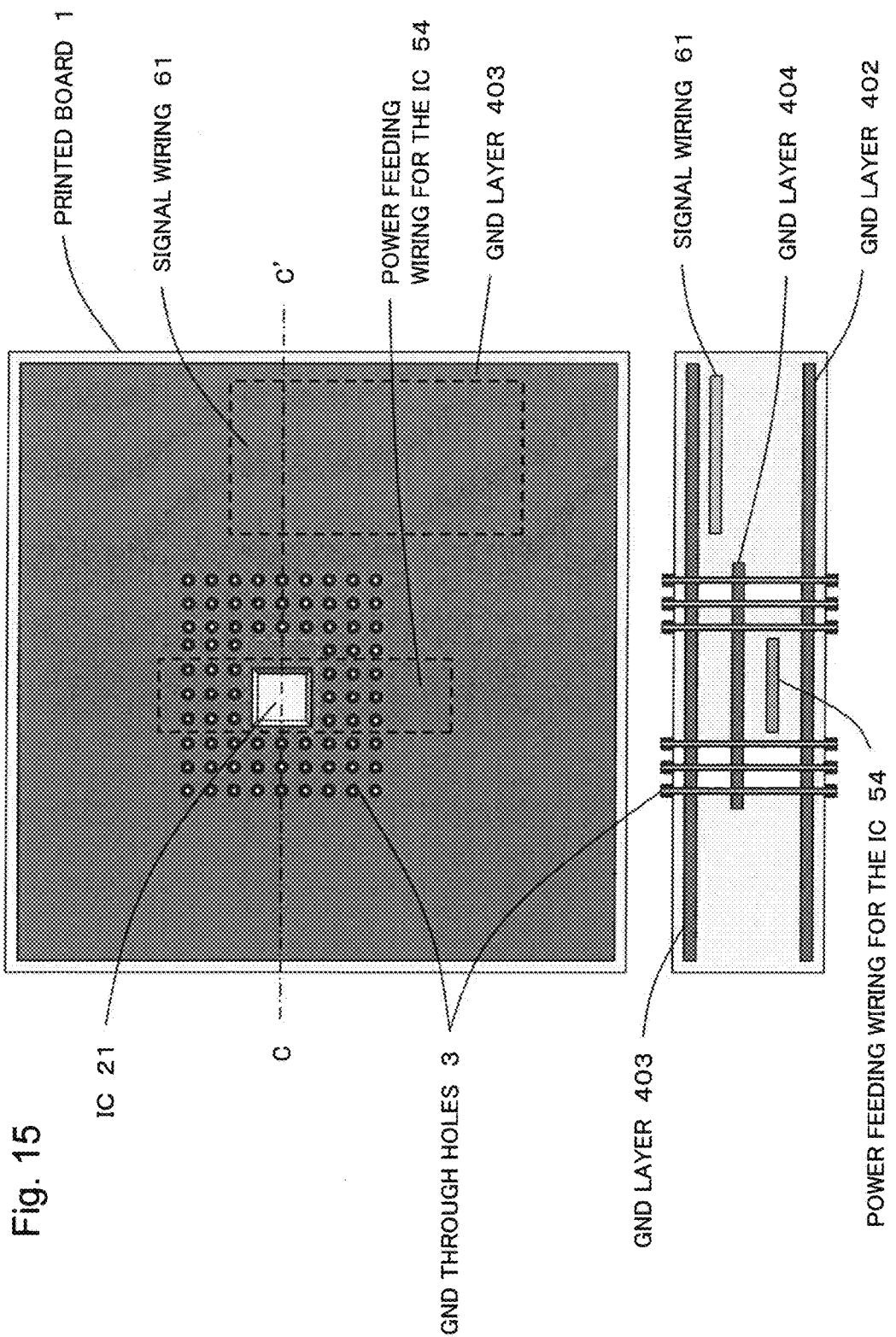
FIG. 15 is a plan view and a cross-sectional view where an upper GND layer of the third example embodiment of the present invention is formed in only a certain portion.

Further in FIG. 14, both of the GND layers 401, 402 are plane grounds. However, any one of the two GND layers may be formed only in a range to be overlapped with the power supply layer and in a range where the GND through holes 3 are formed on both sides of the power supply layer. FIG. 15 is the plan view thereof and the cross sectional view taken along C-C' in the plan view. In the view of the C-C' cross section, the IC 21 is omitted. An upper GND layer 404 of the power supply layers is formed only in the range to be overlapped with the power feeding wiring for the IC 54 in planar view and in the range where the GND through holes 3 are formed.

Further, a plurality of the power supply layers are often formed in the printed board. When, among the plurality of the power supply layers, there are multiple power supply layers to which the EMI emissions are suppressed, the GND layers 404 are also formed for each power supply layer.

Note that in FIG. 14, the GND layer 403 positioned on the top layer is not used for putting the power supply layer between the GND layers and is used mainly for controlling impedance of the signal wiring 61. If there is the power supply layer in the same layer as the signal layer, the GND layer 403 provides the function of suppressing EMI.

Fourth Example Embodiment

In the foregoing third example embodiment, the GND layers and the GND through holes are formed above, below, and around the power supply layer. The third example embodiment may be combined with the structure for suppressing EMI by radially forming the GND through holes in a few circuits along the periphery of the printed board described in the second example embodiment. By such combination, the EMI emissions to circumference of the power supply layers within the board can be suppressed. Further, even when the EMI emissions having higher intensities than the expected intensities are emitted to the outside of the power supply layers, the EMI emissions to the outside of the printed board can be suppressed.

Fifth Example Embodiment

In the foregoing first to fourth example embodiments, although the GND through holes are arranged parallel to the periphery of the printed board or the power supply layers, the GND through holes may be arranged in a zigzag, i.e., in staggered to the periphery of the board. In such arrangement, the intervals between the through holes can be narrower. Therefore, the area of ranges where the through holes are formed can be smaller.

INDUSTRIAL APPLICABILITY

The present invention can be used for electronic circuit designs and manufactures of the information communication equipment etc.

The illustrations of the present invention have been made using the foregoing example embodiments by way of exemplary examples. However, the present invention is not limited to the foregoing example embodiments. Namely, a variety of aspects that may be appreciated by those skilled in the art are applicable to the present invention, within the scope of the invention.

The present application claims priority based on Japanese patent application No. 2015-137091 filed on Jul. 8, 2015, the entire disclosures of which are incorporated herein.

[Reference signs List]

| | |
|---|---|
| 1 | printed board |
| 2 | LSI |
| 3 | GND through hole |
| 41, 42, 43, 401, 402, 403, 404 | GND layer |
| 5 | power supply layer |
| 51, 52, 53 | power supply wiring |
| 6 | signal wiring |
| 21 | IC |

What is claimed is:

1. A printed board, comprising:
a plurality of ground layers disposed in a printed board;
a power supply layer put between the plurality of the ground layers; and
through holes disposed along at least periphery of the printed board and connecting the plurality of the ground layers,
wherein the through holes are disposed at intervals according to a wavelength corresponding to a maximum frequency of electromagnetic waves to be suppressed.

2. The printed board according to claim 1,
wherein each of the intervals is equal to or below a quarter of the wavelength corresponding to the maximum frequency of the electromagnetic waves to be suppressed.

3. The printed board according to claim 1,
wherein the through holes are disposed in at least double rows.

4. The printed board according to claim 1,
wherein the plurality of the ground layers are layers of plane grounds.

5. The printed board according to claim 1, comprising:
a plurality of the power supply layers,
wherein when at least one of the plurality of the power supply layers is formed on a separate layer from the others of the plurality of the power supply layers, the one of the plurality of the power supply layer formed on the separate layer is also put between the ground layers above and below the one of the plurality of the power supply layers.

6. The printed board according to claim 1,
wherein the through holes are arranged parallel or with an inclination to periphery of the printed board or the power supply layer.

7. A printed board, comprising:
a power supply layer disposed in a printed board and put between ground layers above and below the power supply layer; and
a plurality of through holes connecting the ground layers above and below the power supply layer,
wherein the plurality of the through holes are disposed at and near the power supply layer and are spaced apart at intervals according to a wavelength corresponding to a maximum frequency of electromagnetic waves to be suppressed.

8. The printed board according to claim 7, comprising:
through holes disposed along the periphery of the printed board and connecting a plurality of the ground layers,
wherein the through holes are disposed at intervals according to a wavelength corresponding to a maximum frequency of electromagnetic waves to be suppressed.

9. The printed board according to claim 7,
wherein one of the ground layers above and below the power supply layer is formed in a range to be overlapped with the power supply layer and in a range where the through holes are formed on both sides of the power supply layer.

* * * * *